United States Patent
Kardynal et al.

(10) Patent No.: US 7,199,372 B2
(45) Date of Patent: Apr. 3, 2007

(54) CIRCUIT FOR A SINGLE PHOTON DETECTOR

(75) Inventors: Beata Ewa Kardynal, Cambridge (GB); Andrew James Shields, Cambridge (GB)

(73) Assignee: Kabushiki Kaisha Toshiba, Tokyo (JP)

( * ) Notice: Subject to any disclaimer, the term of this patent is extended or adjusted under 35 U.S.C. 154(b) by 96 days.

(21) Appl. No.: 10/890,180

(22) Filed: Jul. 14, 2004

(65) Prior Publication Data
US 2005/0061986 A1    Mar. 24, 2005

(30) Foreign Application Priority Data
Jul. 15, 2003    (GB) .................................. 0316564.4

(51) Int. Cl.
     *G01T 1/24*      (2006.01)
     *G01J 5/00*      (2006.01)

(52) U.S. Cl. ............................. 250/370.01; 250/338.4

(58) Field of Classification Search ........... 250/370.01, 250/338.4
See application file for complete search history.

(56) References Cited

U.S. PATENT DOCUMENTS

| | | | |
|---|---|---|---|
| 4,303,861 A | 12/1981 | Ekstrom | |
| 5,010,588 A | 4/1991 | Gimlett | |
| 6,541,752 B2 * | 4/2003 | Zappa et al. | 250/214.1 |

FOREIGN PATENT DOCUMENTS

| | | |
|---|---|---|
| EP | 1 132 724 | 8/2001 |
| GB | 2 352 087 | 1/2001 |
| JP | 59-127010 | 7/1984 |

* cited by examiner

*Primary Examiner*—David Porta
*Assistant Examiner*—Mindy Vu
(74) *Attorney, Agent, or Firm*—Oblon, Spivak, McClelland, Maier & Neustadt, P.C.

(57) ABSTRACT

A circuit for conditioning the output of a single photon detector, the output of said detector having a stepped electrical output signal with respect to time, the circuit comprising a band pass amplifier, said band pass amplifier having a 3 dB breakpoint equal to and less than the inverse of the expected duration of the rising or falling step of said detector output.

18 Claims, 6 Drawing Sheets

CIRCUIT FOR A SINGLE PHOTON DETECTOR

The present invention is concerned with the field of circuits for conditioning the output of a single photon detector. More specifically, the present invention is concerned with conditioning circuits which may be used to prepare the signal for counting electronics or to allow information to be derived about the operating state of the detector to enable control of the detector.

Single photon detectors are photon detectors which can detect to the accuracy of a single photon. In other words, a single photon arriving at such a detector should provide a measurable output from the detector.

Recently, the need for an industrially useful single photon detector has been heightened by the advent of quantum cryptography of optical signals. In essence, quantum cryptography relies upon the transmission of data bits as single particles, in this case photons, which are indivisible. One way in which the data can be encoded is via the polarisation of the electric field vector of the photons. The key component of such a system is a detector which can respond to individual photons. It has been proposed that quantum cryptography can be used to transmit the key for the encryption of data. Examples of information which might be encrypted in this way are internet data or data from automatic teller machines.

Single photon detection is also useful as a low level light detection means for spectroscopy, medical imaging or astronomy. An optimum signal to noise ratio is achieved when a single photon is detected, as the noise is then limited by the source and it is completely independent of noise arising due to the amplifier or detector itself.

A single photon detector could also be used for time-of-flight ranging experiments where the distance of an object from a fixed point is measured by calculating the time over which a single photon takes to return to a detector. This technique can also be used to scan the surface of an object, even a distant object, to form a spatial image of its surface depth, thickness etc.

GB 2 352 087 describes such a single photon detector which is cheap, compact and mechanically rugged. The detector operates using standard voltages (less than 5V) and can operate at low or room temperature.

The single photon detector described in the above patent application comprises first and second active layers separated by a first barrier layer. The first active layer is a quantum well layer capable of supporting a two dimensional carrier gas and the second active layer comprises at least one quantum dot. The device is capable of detecting a single photon because optical illumination of the device leads to a change in the charge occupancy of the quantum dot or quantum dots and this in turn induces a change in the transport or optical characteristics of the first active layer.

Thus, single photons may be detected by measuring the current through the first active layer. Generally, a single photon absorbed by the detector will result in a stepwise rise in the current through the first active layer, although it should be noted that a stepwise decrease may also be observed in some configurations of the detector. Other parameters of the first active layer may also be measured, for example, the current may be measured in the form of conductivity. Also, the resistivity or voltage across the first active layer may be measured. Regardless of which parameter is measured, a stepwise increase or decrease in the electrical output signal should be observed as photons are absorbed by the detector.

For the remainder of the description, measurements of the detector's current will be discussed. However, it will be appreciated by those skilled in the art that changes in the voltage across the first active layer could also be used. Also, it will be presumed for the rest of the description that the detector is configured such that the current rises as photons are absorbed by the detector.

Although there is a noticeable change in the current of the device as a single photon is absorbed, the change can be very small, typically, about 2 nA.

In order to extract the single photon signal from the current output signal from the first active layer, it has been proposed to use a high-pass filter to act as a differentiator in order to extract the peaks. However, the raw signal is noisy and the use of such a differentiator increases the noise in the conditioned signal making isolation of the current change due to single photons difficult if not impossible to perform.

Even, if as has been proposed, a filter is used to remove very high frequencies, in a differentiator, the upper "3 dB break point" must be well above the frequency of interest. Thus, in the above detector, the upper 3 dB point is well above the inverse of the rising step time. The upper "3 dB break point" is given by $f_{3\ dB}=1/(2\pi)RC$.

In a first aspect, the present invention provides a circuit for conditioning the output of a single photon detector, the output of said detector having a stepped electrical output signal with respect to time, the circuit comprising a band pass amplifier, said band pass amplifier having its upper 3 dB break point equal to or less than the inverse of the expected duration of the photon induced rising or falling step of said detector output.

The use of such a band pass amplifier allows conversion of the steps from the detector output into pulses which may be counted by counting electronics while still minimising the noise from the system. The rising sides of the steps of the current signal are of primary interest. The amplifier changes these steps into pulses.

The band pass amplifier is configured to pass frequencies equal to or less than the inverse of the expected duration of the rising or falling step of said detector output, thus, the upper 3 dB breakpoint of the amplified is equal to or less than the inverse of the expected duration of the rising or falling step of said detector output. Preferably, an upper 3 dB breakpoint which is less than half of the inverse of the expected duration of the rising or falling step of said detector output is used.

The expected duration of the rising or falling of the step of said detector output is easily established for the detector as it is essentially a function of the detector response time once a single photon is absorbed by a quantum dot in the detector. Typically, the rising time of each step is approximately 200 ns but it can be longer or shorter from different detector structures. The inverse of this duration is $5\times10^6$, thus giving a maximum frequency of 5 MHz.

Preferably, the rising time of the step is considered to be the time when the step increases from 10% of its height to 90% of its height.

The lower limit on the frequency is set largely by the operating frequency at which the photons arrive at the detector. The pulses output by the amplifier have a tail, as the lower limit on the frequency of the amplifier is decreased, the tails lengthen thus a larger separation between subsequent photons arriving at the detector is required in order to resolve the signals due to subsequent photons. Typically a lower 3 dB breakpoint of 100 kHz is used. For example, a lower 3 dB breakpoint of 170 kHz allowed a detector speed of 1.7 MHz and a lower 3 dB breakpoint of 230 kHz allowed a detector speed of 2.2 MHz and Preferably, a preamplifier is provided before said band pass amplifier.

Typically, the single photon detector will be held at cryogenic temperatures, for example, liquid nitrogen temperatures or liquid helium temperatures. Thus, the single photon detector may be held at a temperature of less than 77 K and possibly less than 4.2 K and even possibly less than 1.5 K.

In order to extract the signal from the detector in a cryostat, a long wire is required. The photon detector itself has a high input resistance and the long wire extending from the cryostat has a high capacitance. The capacitance of the wire in combination with the high channel resistance of the detector results in a high RC constant which essentially causes the wire to act a low pass filter thus smoothing out the signal from the single photons and limiting the maximum frequency of operation.

Thus preferably an amplification stage is provided in the vicinity of the detector before the signal is passed through a long wire. A long wire is typically considered to be a wire longer than 10 mm but it may differ depending on the required maximum frequency of operation.

If the detector is provided in a cryostat, a cryogenic amplification stage is provided with the single photon detector and is held at cryogenic temperatures. Preferably, this amplification stage comprises a MESFET or HEMT. More preferably, the MESFET or HEMT is connected in a cascode arrangement.

As the single photons arrive at the single photon detector, the quantum dots within the detector become charged. Once all the dots are charged, the photon detector can no longer detect photons and needs to be reset. This may easily be achieved by applying a bias to a gate provided on the detector which depopulates the quantum dots.

The conditioning circuit may comprise a reset stage which is configured to apply a reset signal to the gate of said single photon detector.

The circuit may comprise timing means which are configured to apply said reset signal periodically. In a preferred embodiment, a DC amplifier is provided which receives the output of the single photon detector independent of the band pass amplifier. In other words, the signal does not pass through the band pass amplifier before it passes through the DC amplifier nor does the signal pass through the DC amplifier before it passes through the band pass amplifier. The DC amplifier outputs a signal which is related to the number of dots charged in the single photon detector.

Preferably, the circuit further comprises a comparator which is configured to compare the output of said DC amplifier with a preset value and control means to activate said reset signal depending on the results from the comparator. Thus, if the device is being measured in current mode and the current increases as the number of charged dots increases, a reset signal will be sent when the output from the DC amplifier is above that of the preset value. However, if the device is being measured in resistance mode, the reset signal will be sent when the resistance decreases below that of a predetermined value.

The predetermined value may be determined by measuring the DC output signal of the detector at the point where the efficiency of the system decreases. The efficiency of the system may be determined by measuring the number of pulses detected over the number of photons sent to the detector. For example, the pre-determined value may be the DC output when the efficiency of the system drops to 90% of the initial efficiency.

The DC amplifier, comparator and reset stage may be used in a circuit with the above described bandpass amplifier or may be used in a circuit which does not include the above described bandpass amplifier.

Thus, in a second aspect, the present invention provides a circuit for conditioning the output of a single photon detector, said detector having a stepped electrical output signal with respect to time, the circuit comprising a DC amplification stage, a comparator and a reset stage, said comparator being configured to compare the output of said DC amplifier with a pre-determined value and said reset stage being configured to send a reset signal to said single photon detector depending on the result from the comparator.

The inventors have found that the device may be reset quicker if a bias across the first active layer is changed from its value during detection prior to applying a reset signal or as a reset signal is applied. Typically, a bias of 0V is applied across the source and drain of the detector.

This bias may be set by any of the above described circuits or may be used independently of any of the above described circuits.

Thus, in a third aspect, the present invention provides a circuit for applying a reset signal to a single photon detector, said single photon detector comprising a gate and a channel through which an output signal is measured, said circuit comprising a reset stage configured to apply a reset signal to the gate of said detector and to apply a predetermined bias across said channel prior to applying said reset signal or when said reset signal is applied.

The reset signal may be applied periodically or may be applied when the DC output signal fulfils a predetermined condition as described above.

In a fourth aspect, the present invention provides a single photon receiver comprising a single photon detector configured to emit a stepped electrical output signal, with respect to time, in response to illumination by a single photon and a circuit as described above for conditioning the electrical output of said detector or applying a reset signal.

Preferably, the single photon detector comprises at least one quantum dot. More preferably, the single photon detector comprises first and second active layers separated by a first barrier layer and detecting means for detecting a change in a characteristic of the first active layer and separating means for separating a photo-excited electron-hole pair, wherein the first active layer is a quantum well capable of supporting a two dimensional carrier and a second active layer comprises said at least one quantum dot.

The single photon detector may be any of the types described in GB 2 352 087.

In a fifth aspect, the present invention provides a method of conditioning the output signal from a single photon detector, said output of the detector having a stepped increase in current with respect to time, the method comprising passing the output of the detector through a band pass amplifier, said band pass amplifier having an upper 3 dB point equal to or less than the inverse of the expected duration of the photon induced rising or falling step of said output signal.

In a sixth aspect, the present invention provides a method of applying a reset signal to a single photon detector, said detector having a stepped electrical output signal with respect to time, the method comprising:

passing said output signal through a DC amplification stage;
comparing the output of said DC amplification stage with a predetermined value; and
applying a reset signal to said single photon detector depending on the result from the comparator.

In a seventh aspect, the present invention provides a method of applying a reset signal to a single photon detector, said detector comprising a gate and a channel through which an output signal is measured, said method comprising:
applying a pre-determined bias across said channel; and
applying a reset signal to the gate of said detector after or when said bias is applied across said channel.

The present invention will now be described with reference to the following non-limiting embodiments in which.

Figure 1:
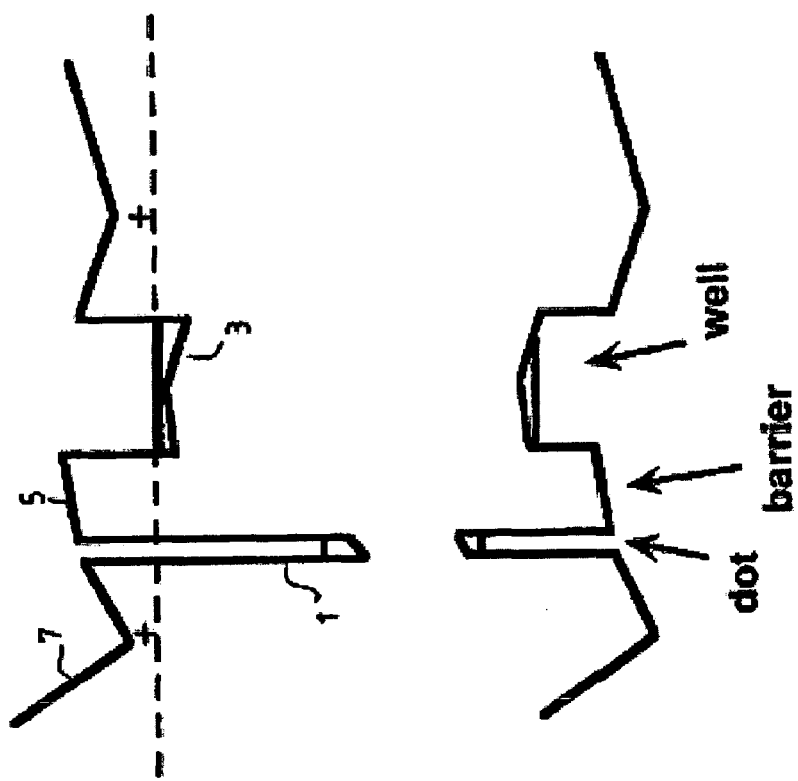
FIG. 1 is a band diagram of a single photon detector which may be used with a conditioning circuit in accordance with a preferred embodiment of the present invention.

FIG. 1 shows a schematic partial band diagram of a single photon detector having a quantum dot layer 1, a quantum well or 2DEG layer 3. The quantum dot layer 1 and the 2DEG layer 3 are separated by a tunnel barrier 5. The device can be irradiated with illumination of almost any wavelength. When the device is illuminated, a single photon will excite an electron-hole pair. The probability of absorption of a photon at any point in the device will depend on the wavelength of the incident radiation, the specific band structure of the device and the position of the illuminated surface of the device with respect to the 2DEG and/or dot layer.

The layers inside the device are subject to electric fields. This can either be an internal electric field due to the internal layer structure of the device or it may be an applied electric field. The electric field causes the photo-excited electron hole pair to separate. Dependent on the band structure and applied electric field, the electron will either become trapped in the conduction band of the quantum dot, or the hole will become trapped in the valence band of quantum dot 1. The presence of a trapped carrier in the quantum dot causes a change in the characteristics of the 2DEG layer 3. Hence, the change in the characteristic of the 2DEG provides a means for detecting a photon.

It has been mentioned above that the device can be illuminated with radiation of virtually any wavelength. The number of carriers excited in each of the barriers, wells and dots depends on the incident photon flux, the absorption coefficient of the layers and their thicknesses. While not wishing to be bound by any theory, it is believed that the following mechanisms contribute to photon detection by the device.

If the radiation has a photon energy higher than the barrier layer 5 or the second barrier layer 7, then electron hole pairs are photo-excited in either the barriers 5 or 7, the quantum well 3 or the dot 1. The internal electric field of the device, or the applied electric field, disassociates the electron hole pair and sweeps them in opposite directions, one type of carrier (either the electron or the hole) will be trapped by the dot and hence produce a change in the transport characteristic of the 2DEG.

If the photon energy of the incident radiation is lower than the band gap of the barrier layers 5 or 7, but higher than the band gap of the 2DEG 3 and also higher than the bandgap of the dot layer 1, then electron hole pairs are excited in both the quantum well layer 5 and the dot layer 1. Essentially no carriers will be excited in the barrier. Since the absorption co-efficient of the quantum well 3 is typically higher than that of the dot layer 1, most of the carriers will be excited in the quantum well. Due to the internal field or the applied electric field, one of the carriers (i.e. either the electron or the hole) can tunnel into the quantum dot 1, leaving the other carrier in the quantum well 3. This causes a change in the characteristic of the 2DEG in the quantum well 3.

If the photon energy of the incident radiation is less than the band gap of the 2DEG (and also the barrier layers) but it is larger than the band gap of the quantum dot 1, then electron hole pairs are excited in the quantum dot 1. One of the carriers can tunnel into the 2DEG layer leaving the other carrier trapped within the dot 1. This also causes a change in the characteristic of the 2DEG 3.

The device can also detect illumination which has a photon energy lower than the band gap of the quantum dot 1, if the quantum dot 1 is designed to contain excess charge. In this situation, a single photon can excite excess charge out of the dot 1 by an intra-band transition. It is then swept away from the quantum dot 1 by applied electric field or an internal electric field. This will also lead to a change in the characteristic of the 2DEG 3.

It should be understood that the quantum well can support either a two dimensional electron gas or a two dimensional hole gas. The polarity of the trapped carriers in the quantum dot 1 can either be the same as that of the two dimensional carrier gas or it can have a different polarity. Regardless of the relative polarities of the carriers trapped in the dot and the carriers in the two dimensional carrier gas, carriers trapped in the dot still affect the characteristics of the two dimensional carrier gas. The applicant does not wish to be bound by a particular theory or express explanation. However, it is believed that the device can operate via two different mechanisms. In the first mechanism, carriers in the quantum well have an opposing polarity to the carriers which are stored in the dots 1. In the second mechanism, the carriers in the quantum well and the carriers stored in the dots are the same type.

The first mechanism will be explained using holes as a stored carrier. However, it will be apparent to a person skilled in the art that either electrons or holes can be stored in the quantum dots depending on the layer thickness and composition, doping polarities (n- or p-type) and applied biases.

In this situation, it is believed that the positive charge stored in the dot 1, alters the band bending and hence persistently alters the characteristics (for example the conductivity of the two dimensional electron gas). This can lead to either an increase or a decrease in the conductivity of the 2DEG.

In the second mechanism the carriers stored in the dots are of the same type as the carriers stored in the well. It is believed that the dot 1 contains excess carriers prior to illumination. The charged dots act as scattering centres for the 2DEG which consequently has a relatively low mobility. After illumination, the number of excess carriers in the quantum dots decreases and the number of electrons in the 2DEG increases. A decrease in the negative charge of the dots results in an increase in the 2DEG conductivity. Also, an increase in the carrier concentration of the 2DEG causes an increase in the conductivity of the 2DEG.

Figure 2:
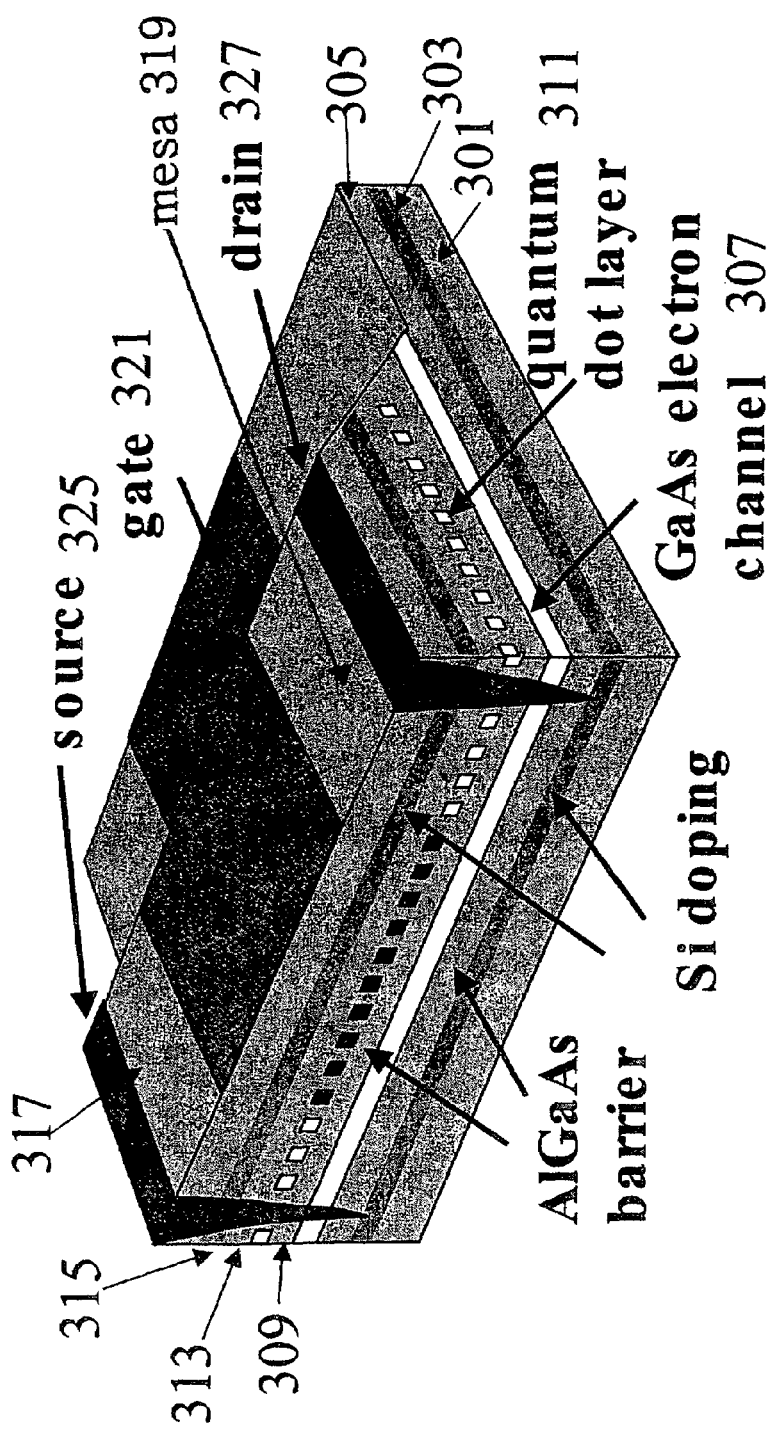
FIG. 2 is a perspective view of a single photon detector which may be used with a control circuit in accordance with an embodiment of the present invention.

FIG. 2 shows an example of a semiconductor layer structure for a single photon detector.

A GaAs undoped buffer layer 301 is formed overlying and in contact with a substrate (not shown). Thin lower doped layer 303 is then formed overlying and in contact with said buffer layer 301. Thin lower doped layer comprises 40 nm of Si doped ($10^{18}$ cm$^{-3}$) GaAs. Lower undoped barrier layer 305 is then formed overlying and in contact with said lower doped layer 303. Lower undoped barrier layer comprises 40 nm of undoped AlGaAs.

Quantum well layer 307 is formed on an upper surface of said lower undoped barrier layer 305. Said quantum well layer comprises 20 nm of undoped GaAs. An upper barrier layer 309 is is then formed on an upper surface of the quantum well layer 307. Said upper barrier layer comprises 10 nm of undoped AlGaAs.

A quantum dot layer 311 is then provided overlying and in contact with said upper barrier layer 309. Said quantum dot layer is a self assembled layer formed by depositing a few nm (typically from 2 nm to 5 nm) InAs on said upper barrier layer 309.

Due to the difference in lattice constants between the upper barrier later 309 and InAs, quantum dots are formed during the growth of layer 311.

An upper undoped AlGaAs layer 313 comprising 50 nm of undoped AlGaAs is then formed overlying said quantum dot layer 311. An upper thin doped AlGaAs layer 315 is then formed overlying said upper undoped GaAs AlGaAs layer 313. Said upper doped layer 315 comprises 30 nm of Si doped ($10^{18}$ cm$^{3}$) AlGaAs. The layer structure is then finished off with an undoped GaAs cap layer 317 of 10 nm thickness.

A mesa etch is performed down to lower barrier layer 305 to define mesa 319. On top of the cap layer 317 is formed a front-gate 321. This gate needs to be able to pass radiation of certain wavelengths. Typically, the gate is made from a thin layer of NiCr with a thickness of about 8 nm. The gate may also be provided by a doped semiconductor layer. The gate 321 extends over said mesa 319 so that contact may be made to front gate 321 away from said mesa.

A source ohmic contact 325 and a drain ohmic contact 327 are made to quantum well layer 307 in the conventional manner. The front gate 321 may be biased with respect to an Ohmic contact 327 to the quantum well layer 307.

Figure 3:
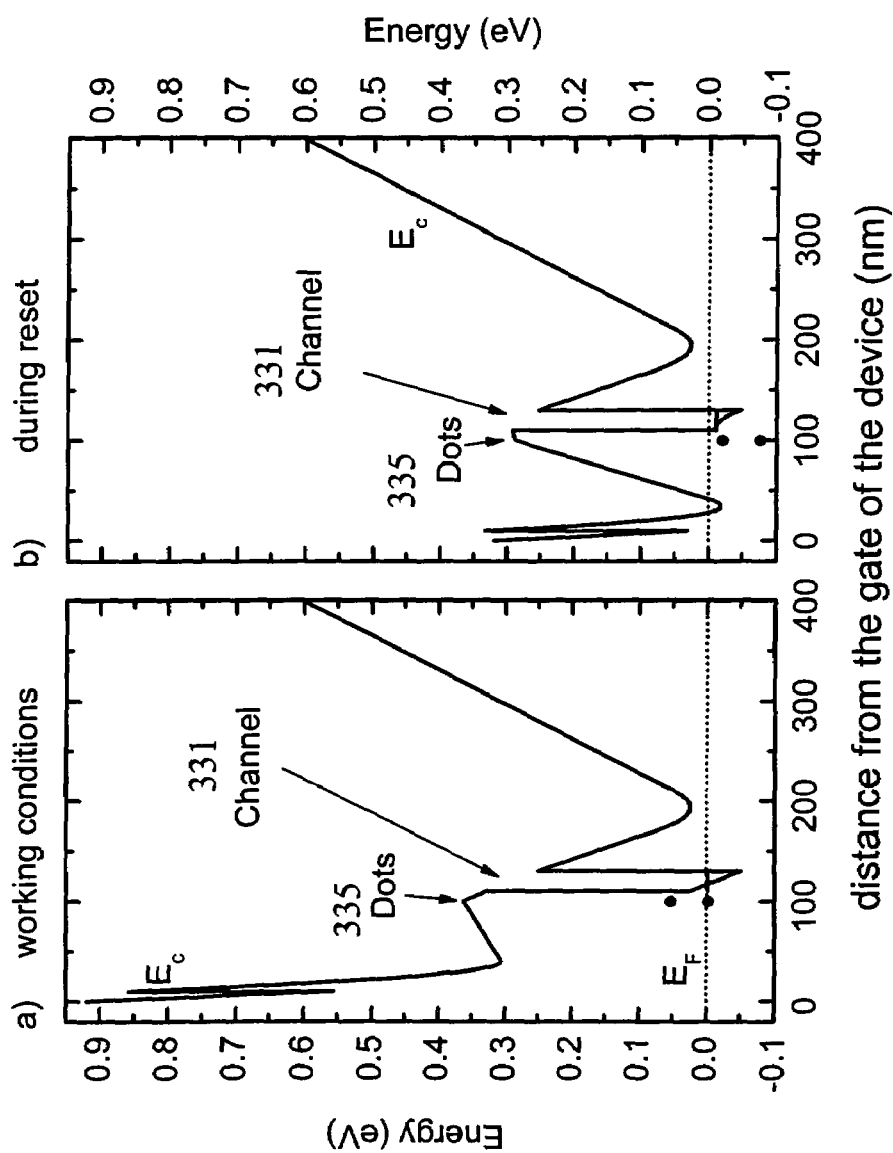
FIG. 3a is a schematic band structure of the device of FIG. 2 in a detection mode and FIG. 3b is a schematic band structure of the device of FIG. 2 during reset.

FIGS. 3a and 3b are plots of the conduction band of the device of FIG. 2 in a detection mode. The y axis of the plot is energy in eV and the x axis is distance from the gate. The Fermi Energy $E_f$ is marked as a dotted line. The quantum well is shown as channel 331 and the position of the dot layer is shown as dots 335.

When the detector is operational as shown in FIG. 3a, the quantum well layer and initially (prior to illumination) the dots are filled up with electrons to the Fermi level. Upon illumination, holes attracted by the negative potential of the dots depopulate the dots 335. Due to the high electron potential energy at the gate, no gate current flows and lower charge state of the dots is persistent in time.

During reset as shown in FIG. 3b, electron potential energy at the gate is low, allowing small current to flow from the quantum well layer to the gate and dots layer repopulating the quantum dots up to the Fermi level.

Figure 4:
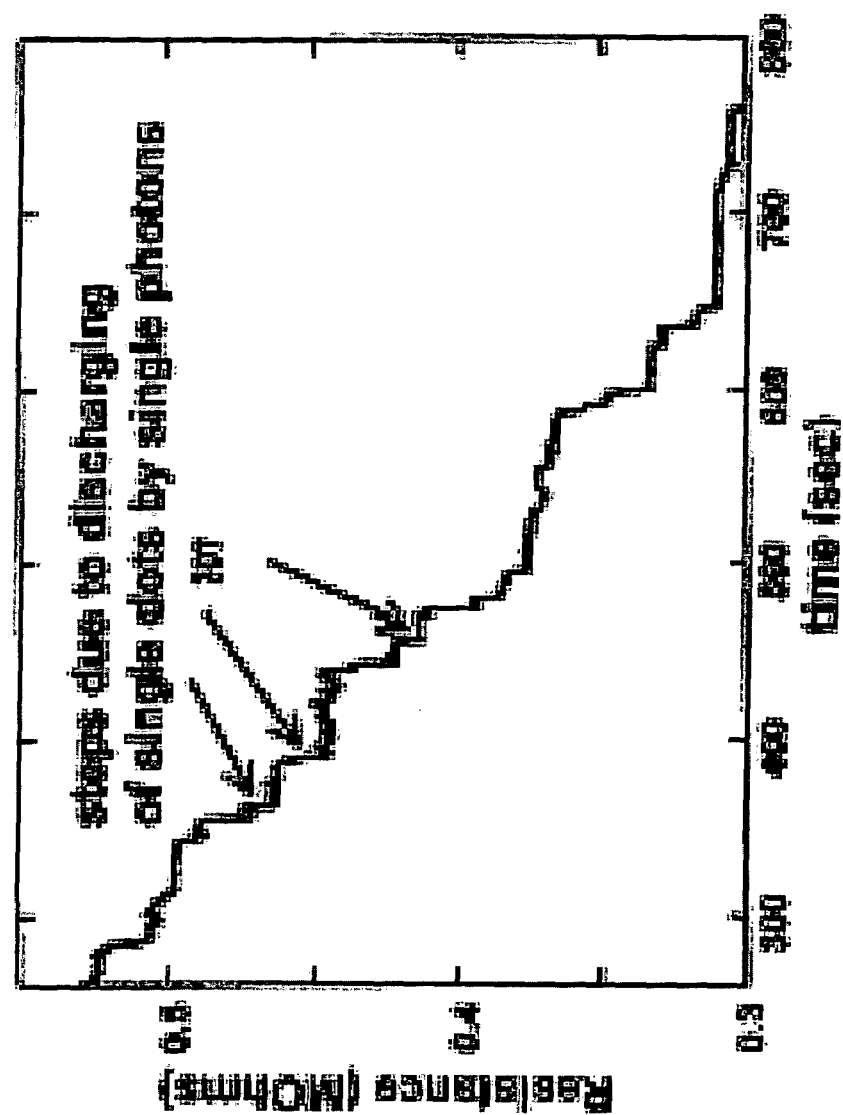
FIG. 4 is a plot of resistance against time for a single photon detector of the type described with reference to FIGS. 1 to 3.

FIG. 4 schematically illustrates a typical output signal. Resistance is parted on the y-axis in MΩ against time and seconds on the x-axis. It can be seen that there are steps 207 in the output signal which are due to the absorption of single photons by the detector.

Although the steps due to single photons 207 are readily identifiable from the plot of FIG. 4, further conditioning of this signal is necessary in order to produce an output where the signal due to the detection of single photons is readily identifiable by either a user of the equipment or by further electronic apparatus which, for example, could be counting apparatus.

Figure 5:
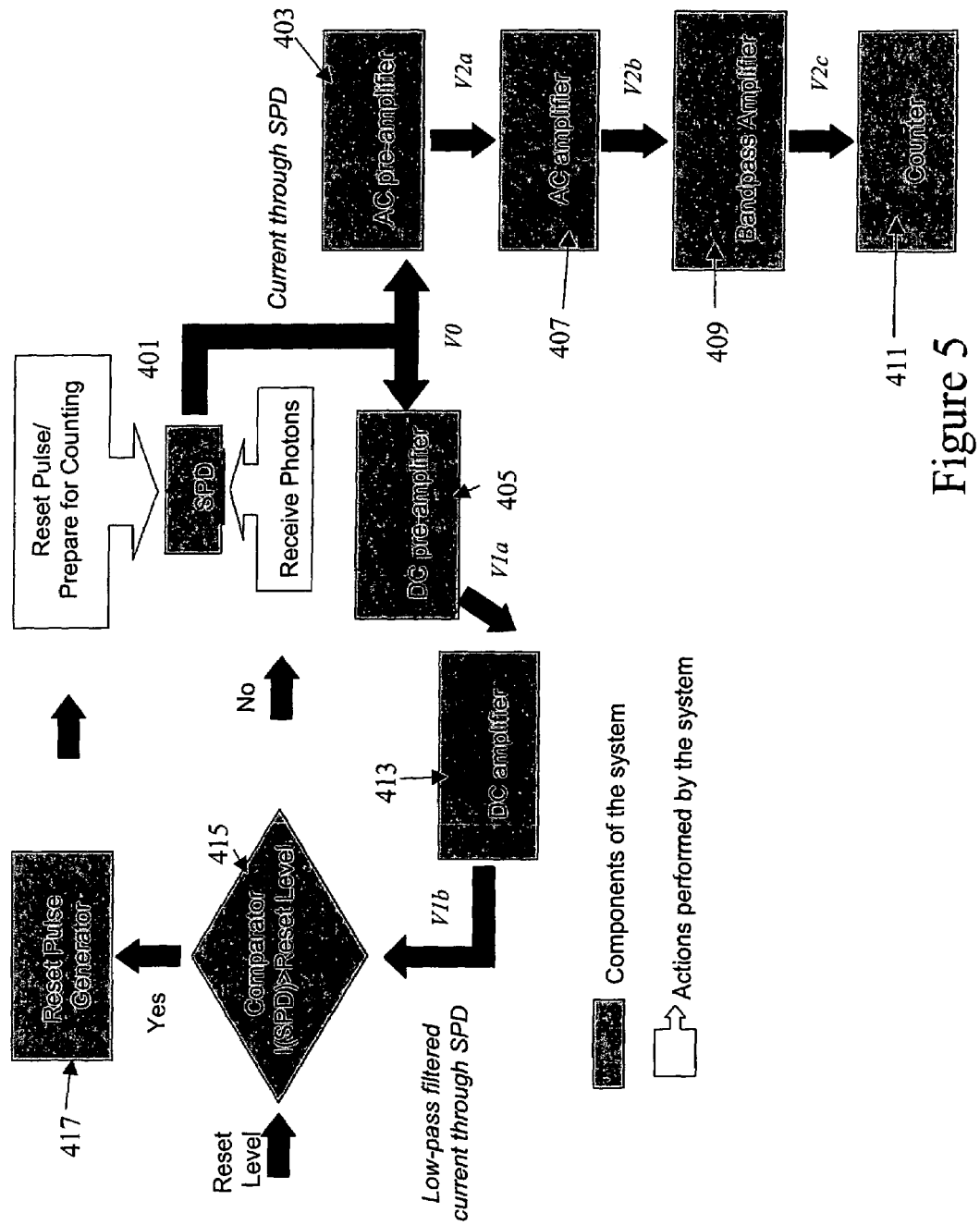
FIG. 5 is a block diagram of the shown functions of a circuit in accordance with a preferred embodiment of the present invention.

FIG. 5 is a block diagram of a conditioning circuit for the type of single photon detector described with reference to FIGS. 1 to 4.

The single photon detector 401 outputs an output signal to both an AC pre-amplifier 403 and a DC pre-amplifier 405. The potential V0 corresponding to current of 1 nA in the single photon detector (typical change of current due to single photon detection is 2 nA or more) of the signal prior to each amplifier is 28 µV.

The details of AC pre-amplifier 403 will be explained with reference to FIG. 6. If the detector is provided in a cryostat, the AC pre-amplifier 403 may be provided within said cryostat.

Once the current has passed through AC pre-amplification stage 403, it is then passed through second AC amplifier 407. The potential V2a between pre-amplifier 403 and second AC amplifier 407 is 2.6 mV.

Pre-amplifier 403 and second AC amplifier 407 essentially form a two-stage pre-amplifier. Typically, one of the amplifiers 403, 407 will be provided within the cryostat and the other outside of the cryostat.

The amplified signal is then passed to bandpass amplifier 409. The potential V2b between second AC amplifier 407 and bandpass amplifier 409 is 71.5 mV. Band pass amplifier 407 allows the rising steps of the current measurement to be isolated and hence provides a function similar to a differentiator.

In FIG. 5, a current measurement is shown where the current increases as more photons are absorbed by the single photon detector. However, it will be appreciated by those skilled in the art that the band pass amplifier will act the same regardless of whether current/conductance or resistance/voltage is being measured.

In this example, the rise time of the steps was 200 ns, thus the maximum 3 db breakpoint frequency is 5 MHz. Here, band pass AC amplifier 409 has a band width of 320 kHz to 1.6 MHz. Higher frequencies may be used which also produce good results, for example, 400 kHz to 3 MHz. However, the signal to noise ratio increases with increasing frequency range. Lower frequencies may also be used, for example, 90 kHz to 800 kHz, however the use of lower frequencies broadens the peaks output by the band pass amplifier which means that the sampling speed of the detector is decreased.

The output from band pass amplifier 407 which consists of a plurality of peaks each indicating a rising or falling step is then directed to photon counter 409. The voltage on the output of the bandpass amplifier (V2c) is 715 mV.

As previously mentioned, some of the output of single photon detector 401 is directed into DC pre-amplifier 405. DC pre-amplifier 405 will be described in more detail with reference to FIG. 6. The output of DC preamplifier 405 is directed into second DC amplifier 413. The potential V1a between DC preamplifier 405 and DC amplifier 413 is 200 µV.

Second DC amplifier 413 extracts the DC signal from the stepwise current signal. The extracted DC current signal is then directed to comparator 415 which compares the extracted DC current signal with a predetermined current reset level. If the current signal extracted by DC amplifier 413 is larger than the reset level, then a pulse is generated by reset pulse generator 417. At this stage, a reset signal is applied to the gate, for example, gate contact 321 in FIG. 2, in order to reset the detector as shown in FIG. 3b. It has been found that the device may be reset quicker if the bias applied to the 2DEG via the source and drain contacts is set to a pre-determined bias, preferably zero, prior to applying a reset pulse to the gate or as said reset pulse is applied to the gate. The comparator can thus also be used to advantageously set the bias across the 2DEG prior to resetting the gate voltage.

If the current outputted by the second DC amplifier 413 is less than the reset conductivity level, then no reset pulse is generated and the single photon detector can continue operating.

By providing this feedback circuit whereby the single photon detector is continually monitored, optimum performance may be achieved because the detector will only be reset when it is necessary to reset the detector. By applying the periodic reset pulse, the detector may not be used to its full capacity as the detector cannot detect photons when a reset pulse is sent. Therefore, it is desirable to only send a reset pulse when necessary.

Figure 6:
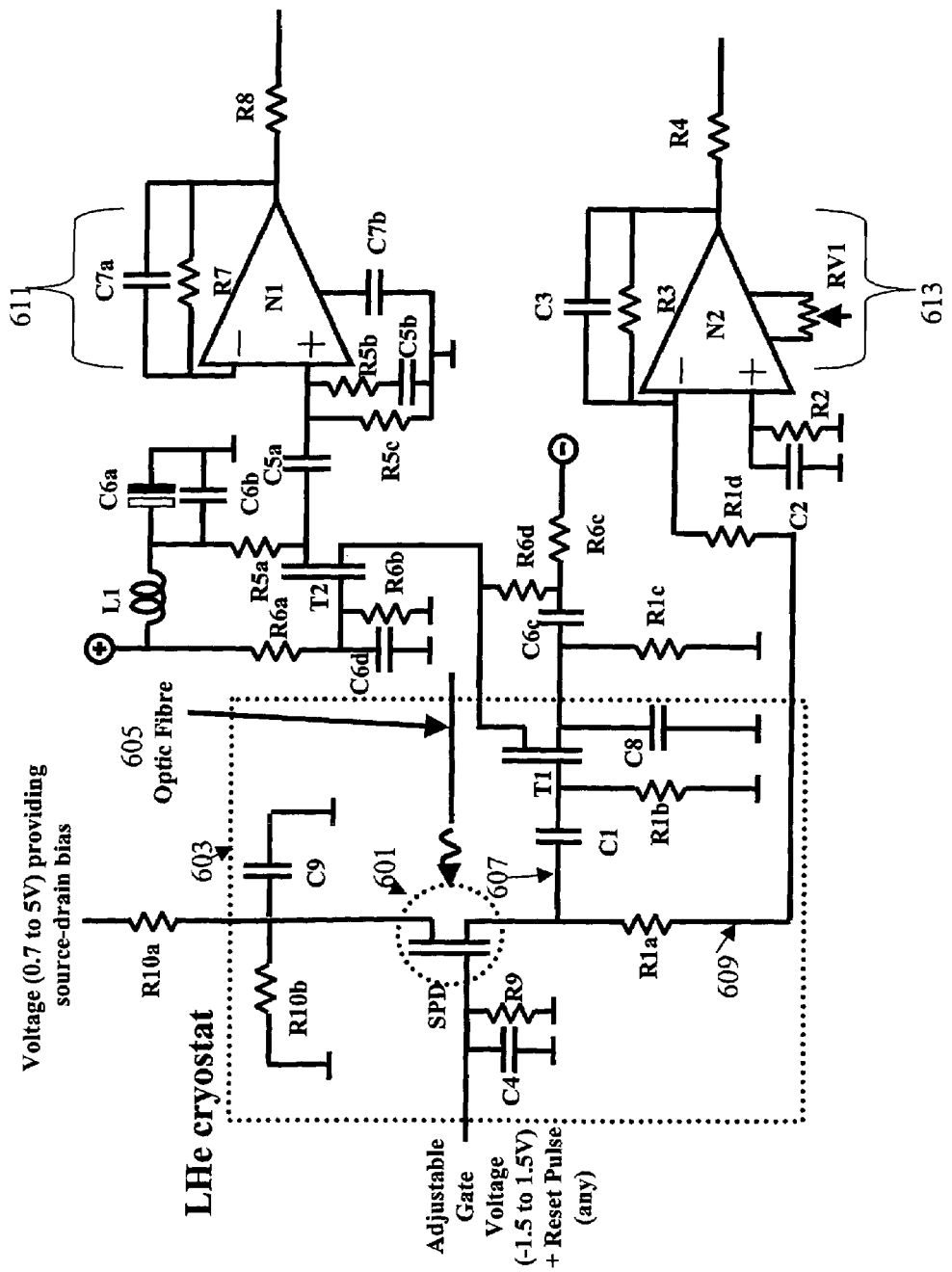
FIG. 6 is a circuit diagram of a control circuit in accordance with an embodiment of the present invention.

FIG. 6 is a detailed schematic of the pre-amplification stages of FIG. 5. In practice, single photon detectors operate at low temperatures, typically, less than 4.2 K and are generally less than 1.5 K.

Single photon detector 601 is provided inside liquid helium cryostat 603. The source-drain bias for detector 601 is provided to detector 601 through resistor R10a. Resistor R10a is a 1 kΩ 1%0.5W metal film resistor. The biasing circuit for detector 601 comprises a voltage divider R10b/R10a and capacitor C9. Resistor R10b is a 15 Ω 1% 0.5 W metal film resistor and Capacitor C9 is a ceramic 100 nF/50V capacitor. The voltage applied to the voltage divider can be varied between 0.7V to 5V producing the source-drain bias of between 10 and 70 mV.

An adjustable Gate bias may be applied to detector 601. The gate bias is adjustable between −1.5V to +1.5V. The biasing circuit for the gate comprises ceramic 10 nF/100V capacitor C4 and 10 kΩ 1% 0.2 W metal film resistor R9.

Radiation for the detector 601 to detect is supplied by optic fibre 605 which extends into cryostat 603.

The source-drain current outputted by the single photon detector 601 is split and directed down a first arm 607 towards AC amplification stages and down second arm 609 towards DC amplification stages.

The current output in first arm 607 is coupled to preamplifier T1 provided within the cryostat 603 using a coupling circuit comprising a capacitor C1 which is a ceramic 100 pF/50V capacitor and resistor R1b which is a 1 MΩ 1% 0.2 W metal film resistor. The current is coupled to the gate of T1 which is an n-channel GaAs MESFET. In this particular example, the MESFET used was a Sony 3SK165.

MESFET T1 is provided inside the cryostat 603 in order to provide an initial preamplification stage. If no amplification is provided within the cryostat, the RC constant arising from the high impedance of the single photon detector 601 and the capacitance of a wire taking the current out of the cryostat becomes too high and the wire acts as a low pass filter destroying the features of interest in the current signal. In addition measurement becomes more noisy.

The MESFET T1 is connected in a cascode arrangement. The cascode arrangement eliminates non-linearities due to current fluctuations through the MESFET by freezing the voltage across the transistor at a constant value. In a cascode arrangement, the source-drain bias is applied through a transistor, in this case Si n-channel FET T2 as opposed to a resistor.

In addition to transistor T2, the bias circuit for MESFET T1 comprises capacitor C8 (ceramic 100 nF/50V capacitor), resistor R1c (1 kΩ 1% 0.2 W metal film resistor), capacitor C6c (ceramic 100 nF/50V capacitor) resistor R6c (1.1 kΩ 1% 0.2 W metal film resisitor) and resistor R6d (10 kΩ 1% 0.2 W metal film resistor). Resistor R6c is connected in series with a negative bias source. Only capacitor C8 is provided inside the cryostat 603, the other components of the MESFET biasing circuit are provided outside the cryostat 603.

The cascode transistor T2 also has its own biasing circuit. Resistor R6a (10 kΩ 1% 0.2 W metal film resistor), a capacitor C6d (ceramic 100 nF/50V capacitor) and resistor R6b (2 kΩ 1% 0.2 W metal film resistor) form the biasing circuit for the gate of transistor T2. Inductor LI (1 mH/0.29 A), capacitors C6a (solid Al 33 mF/16V) and C6b (ceramic 100 nF/50V) connected in parallel with each other and resistor R5a (2 kΩ 1% 0.2 W metal film resistor) form the biasing circuit for the source of transistor T2. Both the biasing circuit for the gate and the source of transistor T2 are connected to the same voltage source.

The current signal from the detector 601 is dropped across resistors R1a+R1d and biases the gate of MESFET T1 through capacitor C1. The channel current of T1 (proportional to the gate bias) then passes from the drain to the source of transistor T2. The output of the cascode is thus a voltage proportional to the AC component of the current through the single photon detector and it is coupled through capacitor C5a (polyester 10 nF/100V) into the non-inverting input of second AC amplifier 611.

Output of this AC pre-amplifier is coupled to the second AC amplifier (407 in FIG. 5) through a low noise op-amp N1 with feedback to the inverting input through capacitor C7a (ceramic SOT100V) and resistor R7 (10 kΩ 1% 0.2 W metal film resistor) connected in parallel.

Capacitor C7b (ceramic 2.2 pF/100V), resistor R5c (100 kΩ 1% 0.2 W metal film resistor), capacitor C5b (ceramic 100 nF/50V) and resistor R5b (1 kΩ 1% 0.2 W metal film resistor) are provided between the power input to said amplifier and the non-inverting input.

The amplified current signal is then passed through resistor R8 (51 Ω 1% 0.5 W metal film resistor) to into band pass AC amplifier (not shown) as described with reference to FIG. 5.

As previously mentioned, the current signal from detector 601 is also directed down second arm 609 for DC amplification which means that the output of this amplifier is proportional to the total rather then only AC component of the single photon detector current. The DC amplification is obtained by using a low pass (with 1 kHz 3 dB point) amplifier. The signal is first passed through resistor R1a (27 kΩ 1% 0.2 W metal film resistor) located within cryostat 603 and then through resistor R1d (1 kΩ 1% 0.2 W metal film resistor) provided outside the cryostat 603 into DC preamplifier 613 (corresponding to DC pre-amplifier 405 in FIG. 5).

DC preamplifier 613 comprises a single op-amp FET N2. The current signal is directed through the inverting input. Feedback is provided to the inverting input through capacitor C3 (polycarbonate 470 pF/63V) and resistor R3 (200 kΩ

1% 0.2 W metal film resistor) connected in parallel. The non-inverting input is connected to ground through capacitor C2 (ceramic 100 nF/50V) and resistor R2 (200 kΩ 1% 0.2 W metal film resistor) connected in parallel.

The power input of op-amp N2 is controlled by Trimpot RV1 (100 kΩ 0.25 W). The output of amplifier 613 is then directed through resistor R4 (51 Ω 1% 0.2 W metal film resistor) to second DC amplifier (not shown). The second DC amplifier is amplifier 413 of FIG. 5.

The invention claimed is:

1. A circuit for conditioning the output of a single photon detector, said detector having a stepped electrical output signal with respect to time and being arranged to separate a photo-excited electron-hole pair and to detect a change in a characteristic due to the presence of the charge of a photo-excited carrier, the circuit comprising a band pass amplifier, said band pass amplifier having an upper 3 dB breakpoint equal to or less than the inverse of the expected duration of the photon induced rising or falling step of said detector output.

2. A circuit according to claim 1, further comprising a pre-amplifier configured to amplify said output prior to further amplification by said band pass amplifier.

3. A circuit according to claim 1, configured to condition the output of a single photon detector held at cryogenic temperatures, wherein said circuit comprises a cryogenic amplification stage.

4. A circuit according to claim 3, wherein said cryogenic amplification stage comprises a MESFET or HEMT transistor.

5. A circuit according to claim 4, wherein said MESFET or HEMT transistor is connected in a cascode arrangement.

6. A circuit according to claim 1, wherein said circuit comprises a reset stage configured to apply a reset signal to said single photon detector.

7. A circuit according to claim 6, wherein said reset stage is configured to apply a pre-reset signal prior to said reset signal.

8. A circuit according to claims 6, further comprising timing means configured to apply said reset signal periodically.

9. A circuit according to claim 1, further comprising a DC amplifier configured to receive the output of said single photon source independent of said band pass amplifier.

10. A circuit according to claim 9 when dependent on claim 6, further comprising a comparator configured to compare the output of said DC amplifier with a predetermined value and said reset stage is configured to activate said reset signal depending on the result from the comparator.

11. A single photon receiver comprising a single photon detector configured to emit an electrical output signal in response to illumination by a single photon and a circuit according to claim 1.

12. A circuit for applying a reset signal to a single photon detector, said detector having a stepped electrical output signal with respect to time and being arranged to separate a photo-excited electron-hole pair and to detect a change in a characteristic due to the presence of the charge of a photo-excited carrier, the circuit comprising a DC amplification stage, a comparator and a reset stage, said comparator being configured to compare the output of said DC amplifier with a preset value and said reset stage being configured to send a reset signal to said single photon detector depending on the result from the comparator.

13. A circuit for applying a reset signal to a single photon detector, said single photon detector comprising a gate and a channel through which an output signal is measured and being arranged to separate a photo-excited electron-hole pair and to detect a change in a characteristic due to the presence of the charge of a photo-excited carrier, said circuit comprising a reset stage configured to apply a reset signal to the gate of said detector and to apply a predetermined bias across said channel prior to applying said reset signal.

14. A single photon receiver according to claim 13, wherein said single photon detector comprises at least one quantum dot.

15. A single photon receiver according to claim 14, wherein said single photon detector comprises first and second active layers separated by a first barrier layer, and detecting means for detecting a change in a characteristic of the first active layer and separating means for separating a photo-excited electron-hole pair, wherein the first active layer is a quantum well layer capable of supporting a two dimensional carrier gas and the second active layer comprises said at least one quantum dot.

16. A method of conditioning the output signal from a single photon detector, said output of the detector having a stepped increase in current with respect to time and the detector being arranged to separate a photo-excited electron-hole pair and to detect a change in a characteristic due to the presence of the charge of a photo-excited carrier, the method comprising passing the output of the detector through a band pass amplifier, said band pass amplifier having an upper 3 dB point equal to or less than the inverse of the expected duration of the photon induced rising or falling step of said output signal.

17. A method of applying a reset signal to a single photon detector, said detector having a stepped electrical output signal with respect to time and being arranged to separate a photo-excited electron-hole pair and to detect a change in a characteristic due to the presence of the charge of a photo-excited carrier, the method comprising:

passing said output signal through a DC amplification stage;

comparing the output of said DC amplification stage with a predetermined value; and applying a reset signal to said single photon detector depending on the result from the comparator.

18. A method of applying a reset signal to a single photon detector, said detector comprising a gate and a channel through which an output signal is measured and being arranged to separate a photo-excited electron-hole pair and to detect a change in a characteristic due to the presence of the charge of a photo-excited carrier, said method comprising:

applying a pre-determined bias across said channel; and applying a reset signal to the gate of said detector after or when said bias is applied across said channel.

* * * * *